United States Patent [19]

DeLalande et al.

[11] Patent Number: 5,098,528
[45] Date of Patent: Mar. 24, 1992

[54] METHOD FOR MAKING AN INTEGRATED TYPE LC COMPONENT

[75] Inventors: Francois DeLalande, Pierre de Bresse; Dominique Poupard, Dijon, both of France

[73] Assignee: Compagnie Europeene De Composants Electroniques LCC, Courbevoie, France

[21] Appl. No.: 721,150

[22] Filed: Jun. 26, 1991

[30] Foreign Application Priority Data

Jul. 13, 1990 [FR] France ................... 90 08953

[51] Int. Cl.⁵ ................ C25D 5/34; H03H 7/32
[52] U.S. Cl. ................ 205/149; 333/185; 333/140; 205/152; 205/200; 205/201; 205/212; 205/213
[58] Field of Search ........... 333/185, 140, 181, 175; 204/42, 38.3, 58

[56] References Cited

U.S. PATENT DOCUMENTS

| 3,202,906 | 8/1965 | Maeda | 333/140 |
| 4,155,154 | 5/1979 | Markarian et al. | 204/58 |
| 4,570,135 | 2/1986 | Kameya | 333/140 |

Primary Examiner—John Niebling
Assistant Examiner—Kishor Mayekar
Attorney, Agent, or Firm—Roland Plottel

[57] ABSTRACT

A method for the making of an integrated type of LC component comprises the following steps;
 the coiling of an elongated element made of a metal with valve effect, the ends of which constitute two electrodes;
 the anodization of the element to form a dielectric layer;
 impregnation by an electrolyte, and
 the positioning of a third electrode in a known way.

Application to integrated passive components.

8 Claims, 1 Drawing Sheet

METHOD FOR MAKING AN INTEGRATED TYPE LC COMPONENT

BACKGROUND OF THE INVENTION

1. Field of the Invention

The present invention relates to a method for the making of an LC type integrated circuit. An LC circuit is formed by the association of an inductive element and a capacitive element, these two elements being designed to work at certain frequencies according to a relationship $LC\omega^2 = 1$. LC components such as these generally have a filtering function and are used, for example, in tuners.

2. Description of the Prior Art

LC components are presently constituted by two elements L and C, made separately and assembled in one and the same package or in one and the same mold. These components have the major drawback of being relatively big and expensive.

There also exist commercially available electrolytic capacitors using an anode made of a metal with valve effect and a solid or liquid electrolyte. Such capacitors are generally made out of an element in the form of an etched foil that is folded or coiled to form the anode block which is subjected to an anodization of the foil to form a thin dielectic layer. This operation is followed by an impregnation or coating of the solid or liquid electrolyte and then a positioning of the cathode contact.

SUMMARY OF THE INVENTION

The present invention is aimed at proposing a method for the manufacture of LC type components that enable the drawbacks of prior art components to be overcome by the making of an integrated type of component.

The present invention is also aimed at proposing a method for the manufacture of an integrated type of LC component using a technique similar to the one used for the manufacture of electrolytic capacitors.

Consequently, an object of the present invention is a method for the making of an integrated type of LC component, comprising the following steps:

- the coiling of an elongated element made of a metal with valve effect, the ends of which constitute two electrodes;
- the anodization of the element to form a dielectric layer;
- impregnation by an electrolyte, and
- the positioning of a third electrode in a known way.

According to a particular embodiment, the coiling may be done on a core that may or may not be removable. Should the core be removable, an unconnected type of coil is obtained. When the coiling is done on a non-removable core, this core may be made of a insulator material so as to form a simple support or a support made of magnetic material, for example ferrite.

According to another alternative embodiment, the coiling may be done on a spindle having a movable magnetic core enabling the value of the inductor to be adjusted.

Furthermore, the elongated element is constituted by a wire or by an elongated foil which may possibly be etched. This wire or this foil is made of a metal with valve effect, namely a metal chosen from among aluminium, tantalum, niobium or other similar metals.

According to another characteristic of the present invention, the value of the inductive element is determined by the length of the elongated element and the value of the capacitive element is determined by the rate of etching of the elongated element and/or the oxidation voltage.

BRIEF DESCRIPTION OF THE DRAWINGS

Other features and advantages of the invention will appear from the following description of a preferred embodiment, made with reference to the appended drawing, in which.

DETAILED DESCRIPTION OF THE INVENTION

Figure 1:
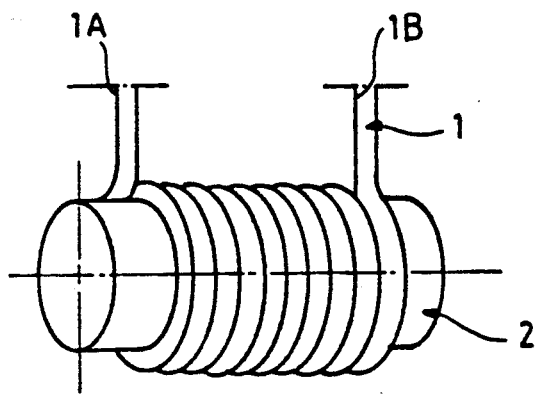
FIGS. 1 to 3 represent different steps of the method for making an LC component of the integrated type according to the present invention.

As shown in FIG. 1, in a first step, a wire 1 is coiled on a spindle 2. This wire, which may or may not be etched, is wound on itself in the form of a solenoid coil having one layer with contiguous turns. However, the wire may also be wound in the form of a solenoid coil with several layers having contiguous or non-contiguous turns. This coiled wire constitutes the inductive part. Consequently, it has a length determined as a function of the value desired for the inductor. Furthermore, the spindle 2 may be constituted by a removable spindle in order to obtain a so-called unconnected coil, or it may be constituted by a non-removable spindle made of an insulating material forming a simple support or of a magnetic material such as ferrite. According to one alternative embodiment (not shown), the wire 1 may be wound on a hollow spindle possessing a tuning plunger core made of magnetic material: this enables the value of the inductive part to be modified. The section of the spindle is circular in the embodiment shown. However, it is clear to those skilled in the art that the spindle may have any section, for example circular, square, rectangular, etc. On the other hand, the spindle may be rectilinear, in the shape of a reel or in the shape of a torus. The wire 1 used in the first invention is made of a metal with valve effect, namely of an anodizable metal such as aluminium, tantalum, niobium or a similar material. The two ends 1A and 1B of the wire form the two electrodes of the inductive part.

Figure 2:
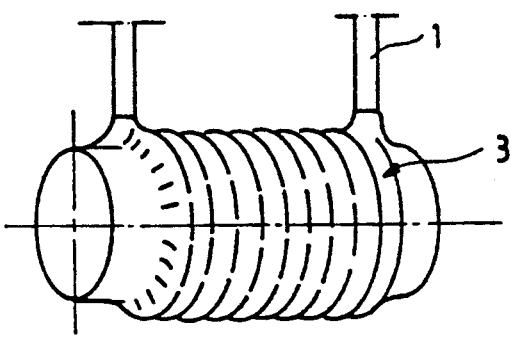
Figure 3:
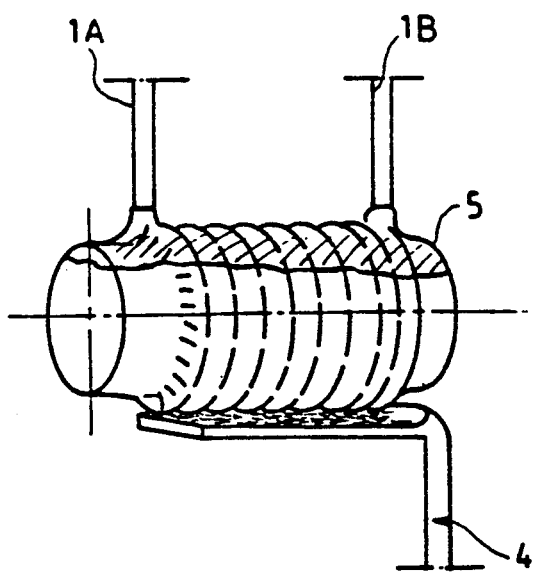

The capacitor part is made by using the techniques known in the field of electrolytic capacitors, more particularly that of solid electrolyte capacitors. Consequently, first of all the anodization, namely the anodic oxidation, of the wire is done so as to create, at one and the same time, the turn-to-turn insulation of the inductor and a dielectric layer for the capacitor. The anodization or oxidation of the wire 1 is done in a standard way by means of a reforming bath such as an ammonium acetate solution, the wire being subjected to an oxidation voltage that enables the value of the capacitive part to be controlled. Then, using means known to those skilled in the art, the anodized wire thus obtained is impregnated or coated with a solid or liquid electrolyte. In the case of a solid electrolyte, several organic or inorganic electrolytes may be used, for example manganese dioxide, with which the wire is impregnated in a manner known per se, by pyrolysis, or electrolytes such as the tetracyanoquinodimethane salts, this product being put into a solution in a solvent such as lactone or acetonitrile and the spindle/wire unit being dipped in the solution. Thus, there is obtained the deposition of a conductive layer 3 forming the third electrode on the unit formed by the oxidized wire 1 and the spindle 2, as shown in FIG. 2. Then, to improve the electrical conductivity between the third electrode or cathode constituted by the electrolyte 3 and the cathode contact 4, the oxidized wire 1 coated with the electrolyte 3 is passed into a graphite bath and they are then covered with a metallization, for example a silver-coating, as shown by the reference 5 in FIG. 3. The cathode contact 4 is fixed to this silver-coating. These steps are well known in the technology of electrolytic capacitors and shall therefore not be described in greater detail. The unit can then be mounted in a package or be molded, whatever may be the finish. In this case, the capacitive element is obtained between the electrode 4 and one of the electrodes 1A or 1B, the value of the capacitive element being a function of rate of etching of the wire and/or of the oxidation voltage. Furthermore, with this LC element, it is possible to make different types of filters, namely $\pi$ filters or C filters, depending on the mode of connection of the different electrodes.

For example, using the standardized C format (6.3 mm×3.5 mm×2.8 mm), it has been possible to obtain an integrated type of LC component having the following capacitance and inductance values:

capacitance of 0.1 $\mu$F to 47 $\mu$F
inductance of 40 nH to 16 $\mu$H which, for this format, provides for every possible combination on a wide range of frequencies going from 5.8 KHz to 2.5 MHz.

The present invention has been described with reference to a wire. However, an elongated foil can also be used.

What is claimed is:

1. A method for the making of an integrated type of LC component, comprising the following steps:
   the coiling of an elongated element made of a metal with valve effect, the ends of which constitute two electrodes;
   the anodization of the element to form a dielectric layer;
   impregnation by an electrolyte, and
   the positioning of a third electrode.

2. A method according to claim 1, wherein the coiling is done on a core that may or may not be removable.

3. A method according to claim 2 wherein, in the case of a non-removable core, said core is made of a magnetic material or of an insulating material.

4. A method according to claim 1, wherein the coiling is done on a spindle having a movable magnetic core.

5. A method according to any of the claims 1 to 4, wherein the elongated element is constituted by a wire or by a foil.

6. A method according to claim 5, wherein the wire or the foil is etched.

7. A method according to claim 1, wherein the element made of a metal with valve effect is made of a metal chosen from among aluminium, tantalum, niobium.

8. A method according to claim 1, wherein the length of the elongated element is a function of the value of the inductive element and wherein the value of the capacitance is given by the rate of etching of the coiled element, the oxidation voltage, or a combination thereof.

* * * * *